(12) United States Patent
Oishi et al.

(10) Patent No.: US 9,225,288 B2
(45) Date of Patent: Dec. 29, 2015

(54) SIGNAL GENERATION CIRCUIT

(71) Applicants: FUJITSU LIMITED, Kawasaki-shi, Kanagawa (JP); FUJITSU SEMICONDUCTOR LIMITED, Yokohama-shi, Kanagawa (JP)

(72) Inventors: Kazuaki Oishi, Yokohama (JP); Masahiro Kudo, Kawasaki (JP); Kotaro Murakami, Yokohama (JP)

(73) Assignees: FUJITSU LIMITED, Kawasaki (JP); SOCIONEXT INC., Yokohama (JP)

( * ) Notice: Subject to any disclaimer, the term of this patent is extended or adjusted under 35 U.S.C. 154(b) by 53 days.

(21) Appl. No.: 14/167,827

(22) Filed: Jan. 29, 2014

(65) Prior Publication Data

US 2014/0285250 A1 Sep. 25, 2014

(30) Foreign Application Priority Data

Mar. 22, 2013 (JP) ................................ 2013-060470

(51) Int. Cl.
| | |
|---|---|
| *G06F 7/44* | (2006.01) |
| *G06G 7/16* | (2006.01) |
| *H03D 7/14* | (2006.01) |
| *H03D 5/00* | (2006.01) |

(52) U.S. Cl.
CPC .............. *H03D 7/1483* (2013.01); *H03D 5/00* (2013.01); *H03D 7/1441* (2013.01); *H03D 7/1466* (2013.01)

(58) Field of Classification Search
USPC .......................................... 327/356, 306, 309
See application file for complete search history.

(56) References Cited

U.S. PATENT DOCUMENTS

| | | | | |
|---|---|---|---|---|
| 4,513,249 | A * | 4/1985 | Baghdady ...................... | 327/356 |
| 5,760,646 | A * | 6/1998 | Belcher et al. ................ | 330/149 |
| 6,112,071 | A * | 8/2000 | McCune, Jr. ................... | 455/337 |
| 6,449,465 | B1 * | 9/2002 | Gailus et al. ................... | 455/126 |
| 6,748,407 | B1 * | 6/2004 | Oga .............................. | 708/271 |
| 6,775,616 | B1 * | 8/2004 | Nysen ........................... | 701/300 |
| 7,346,122 | B1 * | 3/2008 | Cao ............................... | 375/296 |
| 2005/0176388 | A1 * | 8/2005 | Yamawaki et al. ............ | 455/126 |
| 2007/0139107 | A1 * | 6/2007 | Dittmer ......................... | 330/136 |
| 2011/0235689 | A1 | 9/2011 | Kousai | |
| 2013/0027102 | A1 * | 1/2013 | Chen et al. .................... | 327/158 |
| 2014/0073280 | A1 * | 3/2014 | Mikhemar et al. ............ | 455/307 |
| 2014/0247907 | A1 * | 9/2014 | McCune, Jr. .................. | 375/302 |
| 2014/0285250 | A1 * | 9/2014 | Oishi et al. .................... | 327/356 |

FOREIGN PATENT DOCUMENTS

| | | | |
|---|---|---|---|
| JP | 2006-203456 A | 8/2006 | |
| JP | 2011-205181 A | 10/2011 | |

OTHER PUBLICATIONS

Su et al., "An IC Linearizing RF Power Amplifiers Using Envelope Elimination and Restoration," Communications and Optics Research Laboratory HPL-98-186, Nov. 1998, pp. 1-21.

Wang et al., "Design of Wide-Bandwidth Envelope-Tracking Power Amplifiers for OFDM Applications," IEEE Transactions on Microwave Theory and Techniques, vol. 53, No. 4, Apr. 2005, 1244-1255.

* cited by examiner

*Primary Examiner* — Adam Houston
(74) *Attorney, Agent, or Firm* — Arent Fox LLP

(57) ABSTRACT

A signal generation circuit includes a limiter and a mixer. The limiter receives an input signal, allows the input signal to be off a scale at a limit voltage, and generates a phase signal indicating a phase component of the input signal. The mixer receives the input signal and the phase signal, and generates an amplitude signal indicating an amplitude component of the input signal.

11 Claims, 11 Drawing Sheets

SIGNAL GENERATION CIRCUIT

CROSS-REFERENCE TO RELATED APPLICATION

This application is based upon and claims the benefit of priority of the prior Japanese Patent Application No. 2013-060470, filed on Mar. 22, 2013, the entire contents of which are incorporated herein by reference.

FIELD

The embodiments discussed herein are related to a signal generation circuit.

BACKGROUND

In recent years, various types of electronic devices are mounted with wireless communication functions. For example, in a transmitter for wireless communications, a power amplifier is being used to transmit radio waves in the air. Due to outputting signals having large power, the power amplifier is a block consuming large power in the transmitter.

Therefore, in a battery-driven mobile terminal such as a smart phone, a tablet (computer), and the like, it is preferable to reduce power consumption by enhancing power efficiency of a power amplifier. The power amplifier is roughly divided into a linear mode power amplifier and a switch mode power amplifier.

The linear rode power amplifier outputs an input high frequency signal (high frequency input signal) via linear amplification, and it is possible to allow the power amplifier to have a simple circuit configuration since not only phase information (a phase signal) but also amplitude information (an amplitude signal) are able to be simultaneously amplified.

The switch mode power amplifier is capable of amplifying only a phase signal since a transistor is switching-operated and therefore, to amplify an amplitude signal, a separate circuit is provided. For example, in an EER (Envelope Elimination and Restoration) system, a high frequency input signal is separated into a phase signal and an amplitude signal and the switch mode power amplifier is driven by the phase signal. The amplitude signal is amplified via power supply modulation.

The switch mode power amplifier ideally has higher power efficiency than the linear mode power amplifier. The reason is that ideally, during application of a voltage to the drain of a transistor (switch) in the switch mode power amplifier, no drain current flows and in reverse, no drain voltage is applied while drain current flows. This fact is based on the relationship: power consumption=drain voltage×drain current=0.

As describe above, the EER system utilizes a signal generation circuit for generating an amplitude signal and a phase signal from an input high frequency signal (or for separating the latter into the former). To generate an amplitude signal in the signal generation circuit, a rectification circuit employing a diode or a rectification circuit utilizing voltage-current characteristics (Vgs-Id characteristics) of a MOS transistor is being used.

In such a signal generation circuit, distortion components are generated due to the voltage-current characteristics of the diode or the MOS translator. In other words, when a signal generation circuit (amplitude information generation circuit) having large distortion is used for EER, a power amplifier output after combining an amplitude signal and a phase signal by the switch mode power amplifier is also distorted. Therefore, for example, in a wireless communication device, information communications at a low error level become difficult.

In this regard, various types of EER systems for driving a switch mode power amplifier and various types of circuits for generating an amplitude signal from a high frequency input signal has been proposed.

Non-Patent Document 1: Feipeng Wang, et al., "Design of wide-bandwidth envelope-tracking power amplifiers for OFDM applications," IEEE Microwave Theory and Techniques Society, pp. 1244-1255, April 2005

Non-Patent Document 2: David Su, et al., "An IC for Linearizing RF Power Amplifiers Using Envelope Elimination and Restoration," Communications and Optics Research laboratory, HPL-98-186, November, 1998

SUMMARY

According to an aspect of the embodiments, there is provided a signal generation circuit including a limiter and a mixer.

The limiter receives an input signal, allows the input signal to be off a scale at a limit voltage, and generates a phase signal indicating a phase component of the input signal. The mixer receives the input signal and the phase signal, and generates an amplitude signal indicating an amplitude component of the input signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before describing embodiments of a signal generation circuit, examples and problems of an EER system and a signal generation circuit will be described with reference to FIG. 1 to FIG. 3B.

Figure 1:
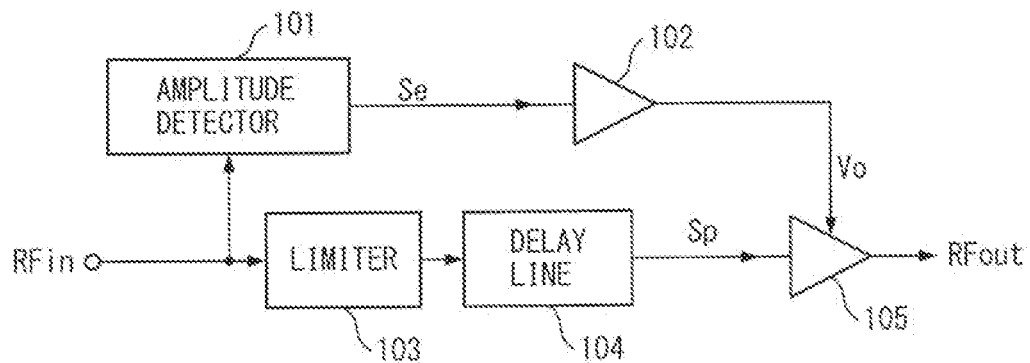
FIG. 1 is a block diagram illustrating one example of an EER system.
Figure 2:
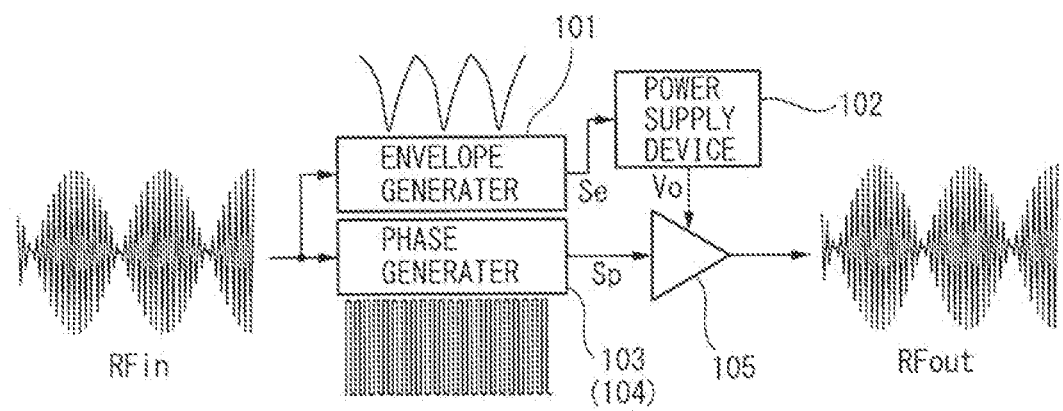
FIG. 2 is a diagram for describing an operation of the EER system illustrated in FIG. 1.

FIG. 1 is a block diagram illustrating one example of an EER system. FIG. 2 is a diagram for describing an operation of the EER system, illustrated in FIG. 1. As illustrated in FIG. 1, the EER system includes an amplitude detector 101, an amplitude amplifier 102, a limiter 103, a delay line 104, and a switch mode power amplifier 105.

As is apparent from a comparison of FIG. 1 and FIG. 2, the amplitude detector 101, the amplitude amplifier 102, and the limiter 103 (the delay line 104) correspond to an envelope generator, a power supply device, and a phase generator, respectively.

A high frequency input signal RFin is allowed to be off the scale at a limit voltage by the limiter 103 and thereafter delayed in the delay line 104 if necessary. Thereby, conversion is made into phase information (a phase signal Sp) indicating a phase component which is then fed as an input signal of the switch mode power amplifier 105.

Further, an envelope of the signal RFin is detected by the amplitude detector (envelope generator) 101 and thereafter the resulting envelope signal Se is amplified in the amplitude amplifier (power supply device) 102 so generate an amplitude signal (an output voltage Vo) indicating an envelope component. The output voltage Vo is applied to a power supply input of the switch mode power amplifier 105.

Herein, the frequency of the high frequency input signal RFin may be, for example, a frequency of several hundred MHz to several GHz is usable, which is not limited thereto. Further, the switch mode power amplifier 105 is an amplifier of class D, class E, or the like.

In this manner, a phase signal Sp of the high frequency input signal RFin is input to the input of the switch mode power amplifier 105 and, an amplitude signal (Vo) of the signal RFin is input to the power supply input thereof, and thereby a high frequency output signal RFout power-amplified is output from the output of the switch mode power amplifier 105.

Figure 3A:
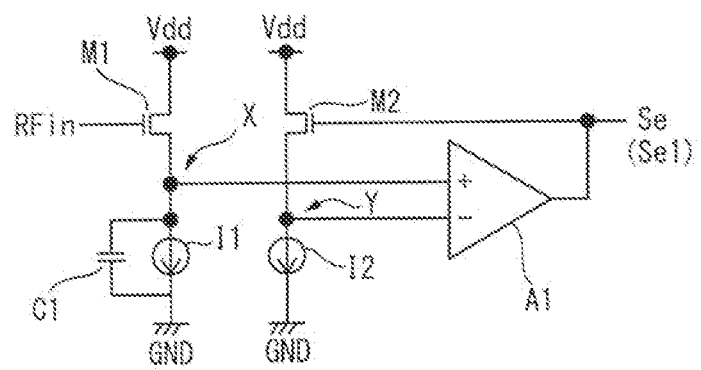
FIG. 3A and FIG. 3B are diagrams for describing one example of a signal generation circuit.
Figure 3B:
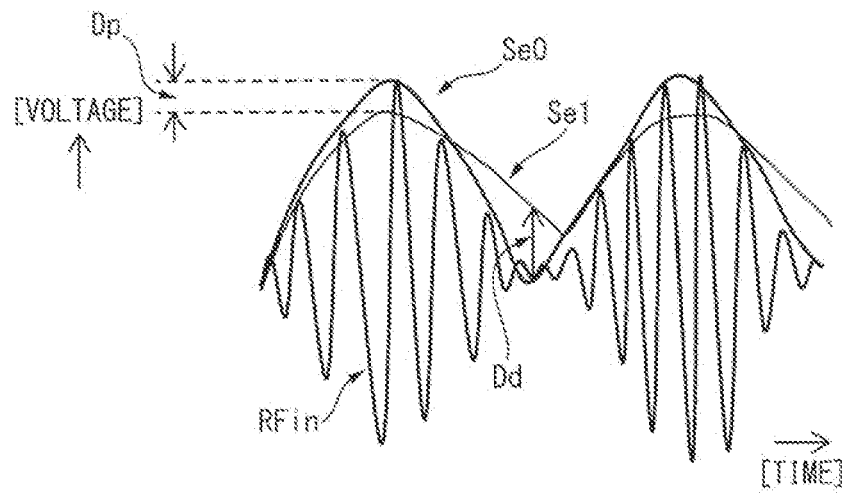

FIG. 3A and FIG. 3B are diagrams for describing one example of a signal generation circuit (envelope generator 101). FIG. 3A illustrates a circuit diagram and FIG. 3B illustrates a waveform diagram.

As illustrated in FIG. 3A, the envelope generator 101 includes n-channel-type MOS transistors (nMOS transistors) M1 and M2, current supplies I1 and I2, a capacitor C1, and an amplifier A1.

The transistor M1 and the current supply I1 are connected in series between a power supply line Vdd and a grounding line GND, and the transistor M2 and the current supply I2 are connected in series between the power supply line Vdd and the grounding line GND. The capacitor C1 is connected in parallel to the current supply I1.

A non-inverting logic input (+) of the amplifier A1 is connected to a common connecting node X of the transistor M1 and the current supply I1, and an inverting logic input (−) of the amplifier A1 is connected to a common connection node Y of the transistor M2 and the current supply I2.

Herein, the high frequency input signal RFin is input to the gate of the transistor M1, and an output signal of the amplifier A1 is input to the gate of the transistor M2 and also the output signal of the amplifier A1 is output as an envelope signal Se.

The amplifier A1 controls a gate voltage of the transistor M2 so as to allow potentials of the nodes X and Y to be equal to each other. The transistor M2 and the current supply I2 configure a pseudo-replica circuit for reducing distortion of a DC voltage and the transistor M1.

In FIG. 3B, reference symbol Se0 indicates an ideal envelope signal (envelope waveform) and reference symbol Se1 indicates an actual envelope signal generated by the envelope generator 101 illustrated in FIG. 3A.

As illustrated in FIG. 3B, it is difficult for the envelope generator 101 illustrated in FIG. 3A to accurately detect an amplitude of the high frequency input signal RFin. Herein, reference symbols Dp and Dd each indicate an error (distortion) between the ideal envelope signal Se0 and the actual envelope signal Se1.

In other words, the envelope generator 101 includes a pseudo-replica circuit based on the transistor M2 and the current supply I2 but, for example, distortion Dp due to square characteristics (voltage-current characteristics: Vgs-Id) of a MOS transistor occurs.

Further, for example, due to current passing through the current supply I1, discharges of the capacitor C1 disposed in parallel to the current supply I1 do not catch up, resulting in distortion Dd. Due to these distortions Dp and Dd contained in the envelope signal, an output of the switch mode power amplifier is also distorted, resulting in a difficulty, for example, in information communications at a low error level.

Figure 4A:
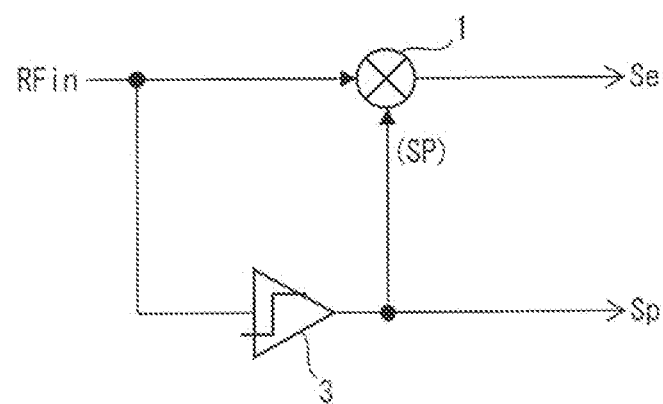
FIG. 4A and FIG. 4B are block diagrams each illustrating a signal generation circuit of a first embodiment.
Figure 4B:
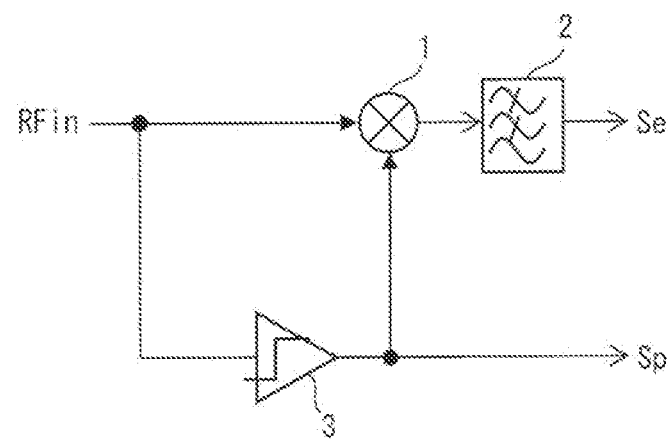

A signal generation circuit of the present embodiment will be described in detail with reference to the accompanying drawings. FIG. 4A and FIG. 4B are block diagrams each illustrating a signal generation circuit of a first embodiment. FIG. 4A illustrates a signal generation circuit having a basic configuration of the first embodiment and FIG. 4B illustrates a modified example of the signal generation circuit illustrated in FIG. 4A.

As illustrated in FIG. 4A, the signal generation circuit of the first embodiment includes a mixer 1 and a limiter 3. The limiter 3 receives a high frequency input signal RFin and allows the input signal RFin to be off the scale at a limit voltage to generate phase information (a phase signal Sp) indicating a phase component.

The mixer 1 receives the input signal RFin and the phase signal Sp from the limiter 3, followed by full-wave rectification by multiplying the signals RFin and Sp to generate an envelope signal (amplitude signal) Se indicating an amplitude component of the input signal RFin.

Thereby, the high frequency input signal RFin is able to be generated with separation into the phase signal (phase information) Sp and the amplitude signal (amplitude information) Se. The phase signal Sp and the amplitude signal Se generated by the signal generation circuit are input, for example, to the switch mode power amplifier (105) of the EER system illustrated with reference to FIG. 1 and FIG. 2 to output a high frequency output signal RFout.

FIG. 4B illustrates a modified example of the signal generation circuit illustrated in FIG. 4A, the example including a low-pass filter (LPF) 2 added to an output stage of the mixer 1. The low-pass filter 2 eliminate (reduces) high frequency components in the amplitude signal Se that is an output of the mixer 1 but is unnecessary, for example, in the case where a finite band of the mixer 1 directly eliminates the high frequency components.

Adoption of a passive type (switch type: passive mixer) having enhanced linearity as the mixer 1 makes it possible to generate an amplitude signal Se having low distortion. Herein, an output of the limiter 3 is usable as the phase signal Sp.

Figure 5:
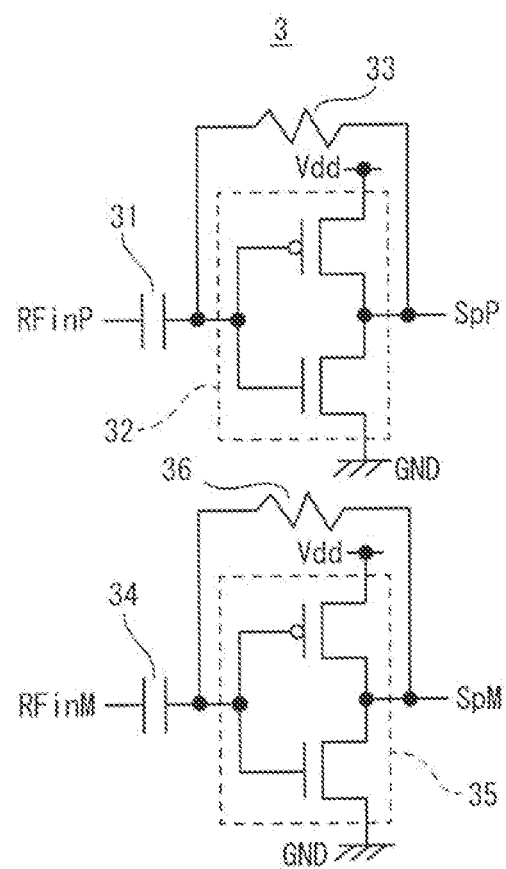
FIG. 5 is a circuit diagram illustrating one example of a limiter adopted in each embodiment.

FIG. 5 is a circuit diagram illustrating one example of the limiter 3 adopted in each embodiment. As illustrated in FIG. 5, the limiter 3 adopts the same circuit configuration, for example, for differential high frequency input signals RFinP and RFinM each. In the following description, each differential signal is described as a (complementary) signal but needless to say, a single-ended signal is employable.

The limiter 3 includes capacitors 31 and 34, inverters 32 and 35, and resistances 33 and 36 connected between the input and output of the inverters. In other words, the differential high frequency input signals RFinP and RFinM are input to the inverters 32 and 35 via the capacitors 31 and 34, respectively, and the outputs of the inverters are returned to the inputs thereof via the resistances 33 and 36.

Thereby, the differential high frequency input signals RFinP and RFinM are limited (allowed to be off the scale) in accordance with the inverters 32 and 35 and the feedback resistances 33 and 36, respectively, and then phase signals SpP and SpM becoming a high level "H." or a low level "L" in accordance with the frequencies of the input signals are output.

Herein, the limiter illustrated in FIG. 5 is merely an example and needless to say, those having various types of circuit configurations are employable.

Figure 6A:
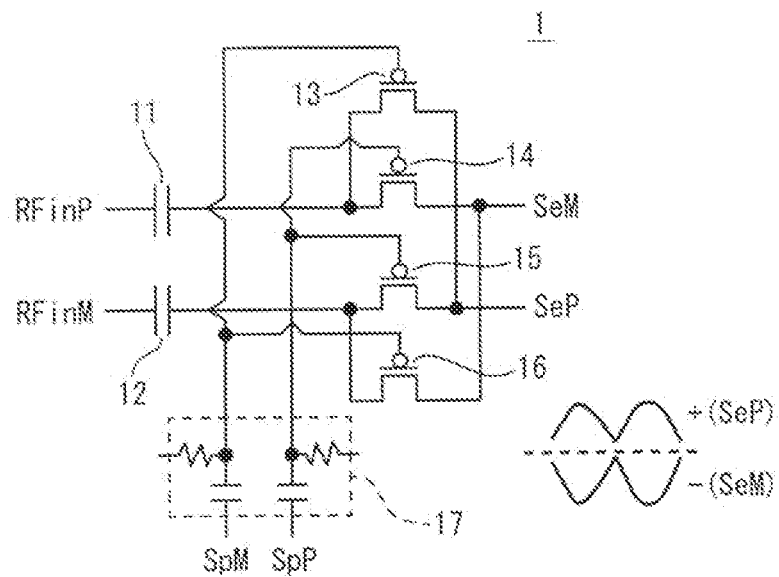
FIG. 6A and FIG. 6B are circuit diagrams each illustrating an example of a mixer adopted in each embodiment.
Figure 6B:
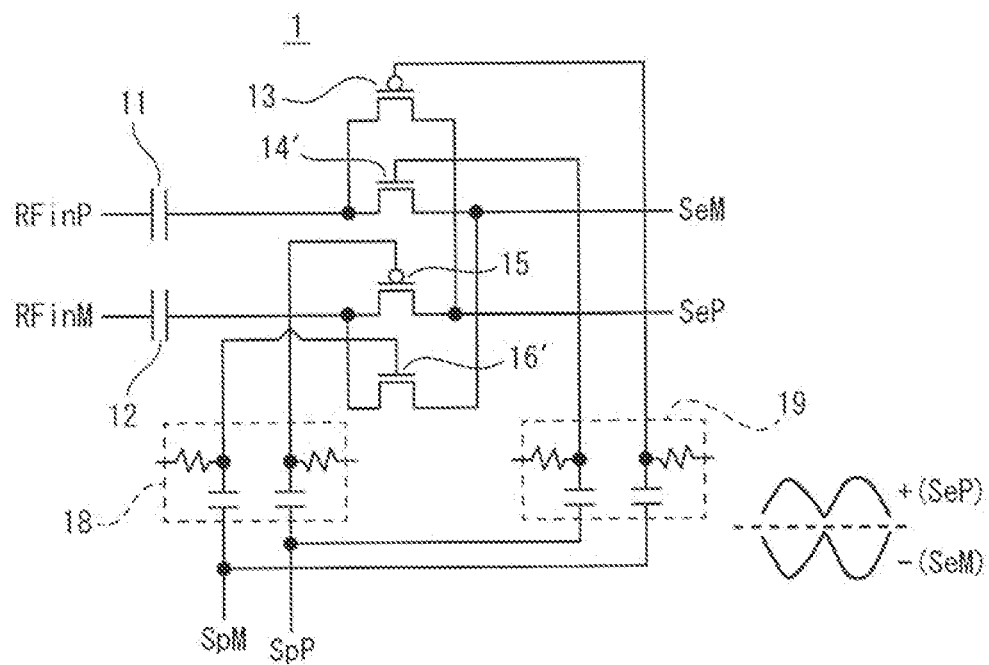

FIG. 6A and FIG. 6B are circuit diagrams each illustrating an example of a mixer adopted in each embodiment. FIG. 6A illustrates one example of the mixer and FIG. 6B illustrates another example of the mixer. The mixers illustrated in FIG. 6A and FIG. 6B are passive-type mixers using a correct MOS transistor.

As illustrated in FIG. 6A, a mixer 1 includes capacitors 11 and 12, pMOS transistors 13 to 16, and a DC level shifter 17.

One differential high frequency input signal RFinP is input to the sources (the drains) of the transistors 13 and 14 via the capacitor 11 and then a positive logic amplitude signal SeP and a negative logic amplitude signal SeM are extracted from the drains (the sources) of the transistors 13 and 14.

The other differential high frequency input signal RFinM is input to the sources of the transistors 13 and 16 via the capacitor 12 and then a positive logic amplitude signal SeP and a negative logic amplitude signal SeM are extracted from the drains of the transistors 15 and 16. Herein, the drains (SeP) of the transistors 13 and 13 are commonly connected and the drains (SeM) of the transistors 14 and 16 are also commonly connected.

An output signal (negative logic phase signal) SpM of the limiter 3 as input to the gates of the transistors 13 and 16 via the DC level shifter 17 and on the other hand, a positive logic phase signal SpP is input to the gates of the transistors 14 and 15 via the DC level shifter 17.

The DC level shifter 17 controls (level-shifts) a DC voltage level for each of the differential phase signals SpP and SpM from the limiter 3, for example, using a capacitor and a resistance to perform multiplication (full-wave rectification) with the differential high frequently input signals RFinP and RFinM.

Herein, the DC level shifter 17 is not limited to those illustrated and various types thereof are employable. In addition, all of the pMOS transistors 13 to 16 are possibly nMOS transistors.

In general, when a MOS transistor (switch) is turned on, a higher voltage is preferably applied between the gate and the source (drain). In other words, for example, in a pMOS transistor, when a negative logic amplitude signal and the input signal RFin are momentarily at low potential, in some cases, it becomes difficult to ensure a sufficient gate-source voltage for switching on even if a gate voltage (limiter output) is at low potential.

This fact possibly would become problematic since a source voltage is largely shifted toward a low potential side when, for example, an amplitude (amplitude signal) of the high frequency input signal RFin is large.

The mixer illustrated in FIG. 6B is intended to solve the abovementioned problem. As transistors for generating a negative logic voltage amplitude signal (SeM), nMOS transistors 14' and 16' are used. In other words, the mixer 1 illustrated in FIG. 6B includes capacitors 11 and 12, pMOS transistors 13 and 15, nMOS transistors 14' and 16', and DC level shifters 18 and 19.

One differential high frequency input signal RFinP is input to the sources of the pMOS transistor 13 and the nMOS transistor 14' via the capacitor 11. Then, a positive logic amplitude signal SeP is extracted from the drain of the transistor 13, and a negative logic amplitude signal SeM is extracted from the drain of the transistor 14'.

The other differential high frequency input signal RFinM is input to the sources of the pMOS transistor 15 and the nMOS transistor 16' via the capacitor 12. Then, a positive logic amplitude signal SeP is extracted from the drain of the transistor 15, and a negative logic amplitude signal SeM is extracted from the drain of the transistor 16'.

The drains (SeP) of the pMOS transistors 13 and 15 are commonly connected and the drains (SeM) of the nMOS transistors 14' and 16' are also commonly connected.

The output signals (differential phase signals) SpP and SpM of the limiter 3 are input to the gates of the transistors 13 and 14' via the DC level shifter 19, and the differential phase signals SpP and SpM are input to the gates of the transistors 15 and 16' via the DC level shifter 18, respectively.

Thereby, when the output Sp (SpP, SpM) of the limiter 3 is at high potential, the nMOS transistors 14' and 16' are switched on. At that time, a higher gate-source voltage is applied, resulting in a more ideal ON operation.

Further, for example, when the output Sp (SpP, SpM) of the limiter 3 is at low potential, the pMOS transistors 13 and 15 are switched on. At that time, a higher gate-source voltage is applied, resulting in a possibility of a more ideal ON operation.

In other words, in the mixer 1 illustrated in FIG. 6B, the positive logic amplitude signal SeP is generated by the pMOS transistors 13 and 15, and the negative logic amplitude signal SeM is generated by the nMOS transistors 14' and 16'. Herein, as described above, the DC level shifters 18 and 19 are not limited to those illustrated.

Figure 7:
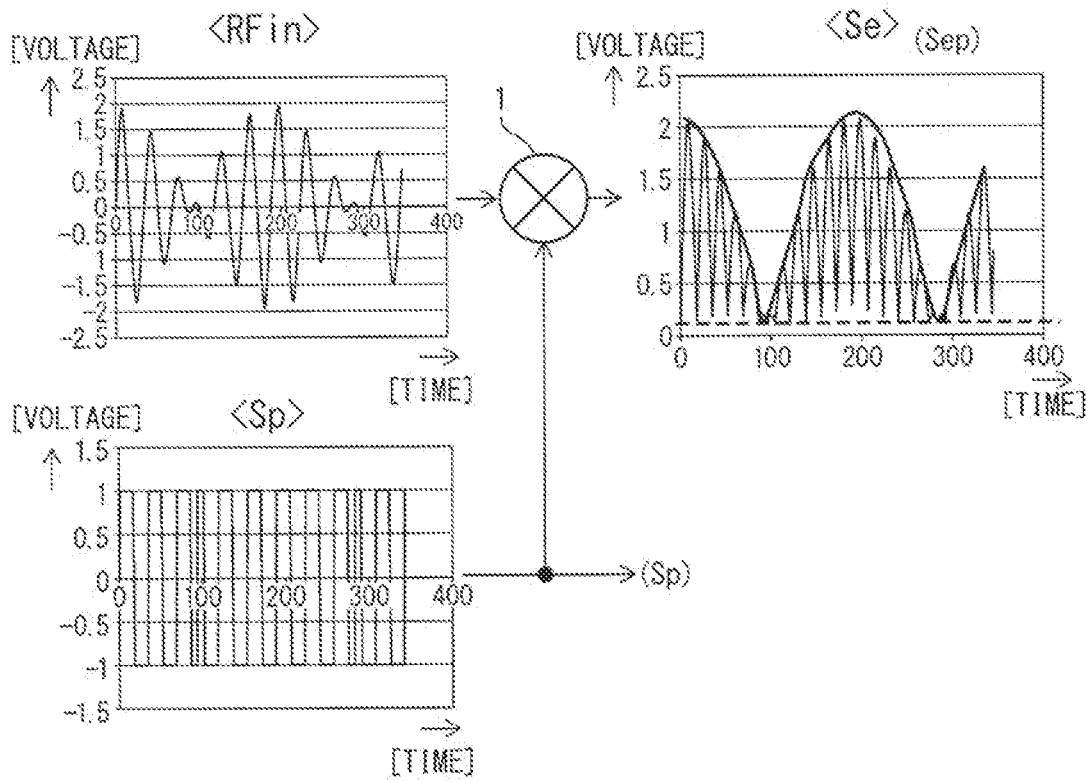
FIG. 7 is a chart for describing an operation of the signal generation circuit illustrated in FIG. 4A.

FIG. 7 is a chart for describing an operation of the signal generation circuit illustrated in FIG. 4A, illustrating an example of each signal waveform (positive logic amplitude signal SeP) in the signal generation circuit illustrated in FIG. 4A. In other words, the illustration of processing by the low-pass filter 2 in the signal generation circuit illustrated in FIG. 4B is omitted.

As the limiter 3, for example, the limiter illustrated in FIG. 5 is employable, and as the mixer 1, for example, the mixer illustrated in FIG. 6B is employable. The MOS transistors (13, 14', 15, and 16') each in the mixer 1 operate substantially similarly to an ideal switch.

The limiter 3 receives the high frequency input signal RFin, allows the input signal RFin to be off the scale (as a substantially rectangular waveform) at a limit voltage, and outputs the resulting signal as a phase signal <Sp> indicating a phase component (frequency component). The limit voltage for specifying the phase signal Sp is intended, for example, to control switching of the transistors 13, 14', 15, and 16' via the DC level shifters 18 and 19 and therefore, does not need to be controlled strictly at a predetermined level.

In the mixer 1, the MOS transistors 13, 14', 15, and 16' are switching-controlled based on whether the phase signal <Sp> from the limiter 3 is at high potential "H" or low potential "L".

The high frequency input signal <RFin> (RFinP, RFinM) that is a differential signal is fed, for example, to the differential input of the mixer 1 of FIG. 6B and then the positive and negative thereof are reversed by the output signal <Sp> (SpP, SpM) of the limiter 3 to be output as a mixer output <Se> (positive logic amplitude signal SeP).

In other words, the mixer 1 performs multiplication (full-wave rectification) of the high frequency input signal RFin and the output signal (phase signal) Sp of the limiter 3 to output an amplitude signal (SeP) indicating an amplitude component. The negative logic amplitude signal SeM is obtained by reversing the positive logic amplitude signal SeP.

Since the mixer 1 is able to perform substantially ideal multiplication, the amplitude signal Se (SeP, SeM) output from the mixer 1 becomes a low distortion signal.

Figure 8:
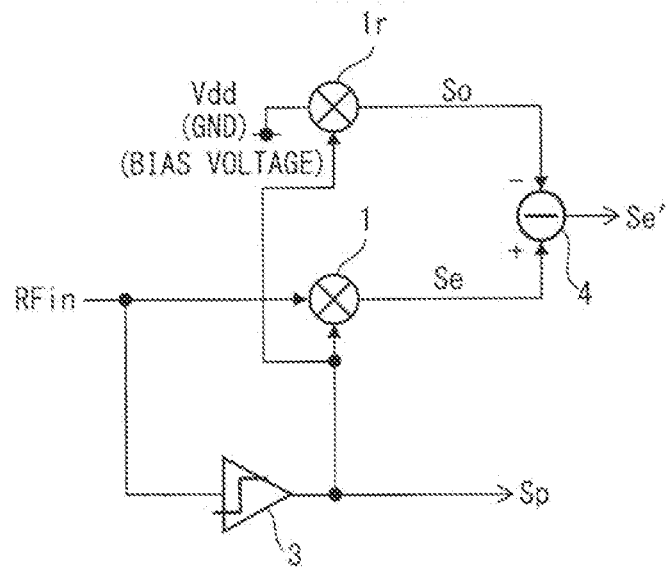
FIG. 8 is a block diagram illustrating a signal generation circuit of a second embodiment.

FIG. 8 is a block diagram illustrating a signal generation circuit of a second embodiment. As is apparent from a comparison of FIG. 8 and FIG. 4A described above, the signal generation circuit of the second embodiment includes a replica mixer 1r and a subtractor 4 added to the signal generation circuit illustrated in FIG. 4A.

The signal generation circuit of the first embodiment described above has a possibility that due to self-mixing of the mixer used for full-wave rectification, the amplitude signal Se to be output contains a DC offset voltage (or an offset voltage) that becomes an unnecessary component.

For example, in the case of an application to the EER system, the DC offset voltage causes distortion of a power amplifier output after the switch mode power amplifier has combined amplitude information and a phase signal. As described above, such distortion makes it difficult that, for example, a wireless communication device communicates information at a low error level.

The self-mixing refers to a phenomenon that a second input of the mixer 1 (an output of the limiter 3: phase signal Sp) is leaked in a first input (RFin) or an output (Se) of the mixer 1 and then multiplied by the second input (self-multiplied), and a Dc offset voltage is output.

To reduce an influence caused by the DC offset voltage due to the self-mixing, in the signal generation circuit of the second embodiment, the replica mixer 1r and the subtractor 4 are added.

In the same manner as in the mixer 1 an output (phase signal Sp) of the limiter 3 is input to a second input of the replica mixer 1r, and a fixed voltage (for example, a power supply voltage Vdd, a grounding voltage GND, or a predetermined bias voltage) is applied to a first input of the replica mixer 1r. Thereby, an output So of the replica mixer 1r contains the same DC offset voltage (replica offset voltage Voffr) as in the actual mixer 1.

The replica offset voltage Voffr based on the replica mixer 1r is subtracted from the output (amplitude signal) Se of the mixer 1 using the subtractor 4 and then the output of the subtractor 4 becomes an amplitude signal Se' where the DC offset voltage based on the mixer 1 is eliminated.

Figure 9:
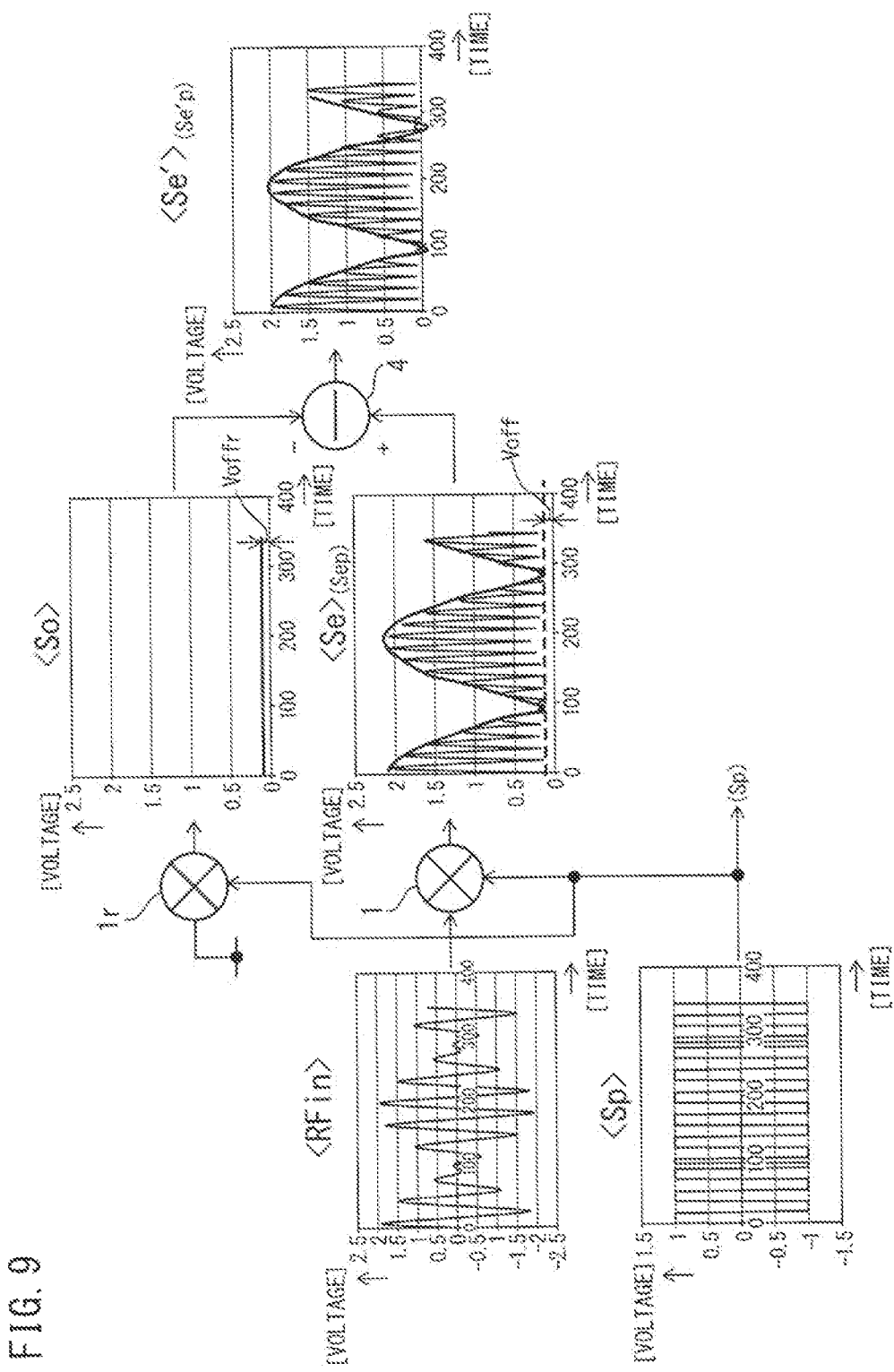
FIG. 9 is a chart for illustrating an operation of the signal generation circuit illustrated in FIG. 8.

FIG. 9 is a chart for illustrating an operation of the signal generation circuit illustrated in FIG. 8. Herein, in FIG. 9, the waveforms of signals <RFin>, <Sp>, and <Se> are the same as those in illustrated in FIG. 7.

As illustrated in FIG. 9, the amplitude signal <Se> (SeP) output from the mixer 1 contains an offset voltage Voff, and the output of the replica mixer 1r also has a replica offset voltage Voffr equivalent to the offset voltage Voff.

Subtraction of the replica offset voltage Voffr of the replica mixer 1r from the output <Se> of the mixer 1 containing the offset voltage Voff using the subtractor 4 makes it possible to obtain an amplitude signal <Se'> (Se'P) containing no offset voltage Voff.

In the case of a differential signal, for example, a negative logic amplitude signal SeM, in the same manner as in the positive logic amplitude signal SeP, it as possible to obtain an amplitude signal (Se'P) where a DC offset voltage is offset (eliminated) using the replica mixer and the subtractor.

Figure 10A:
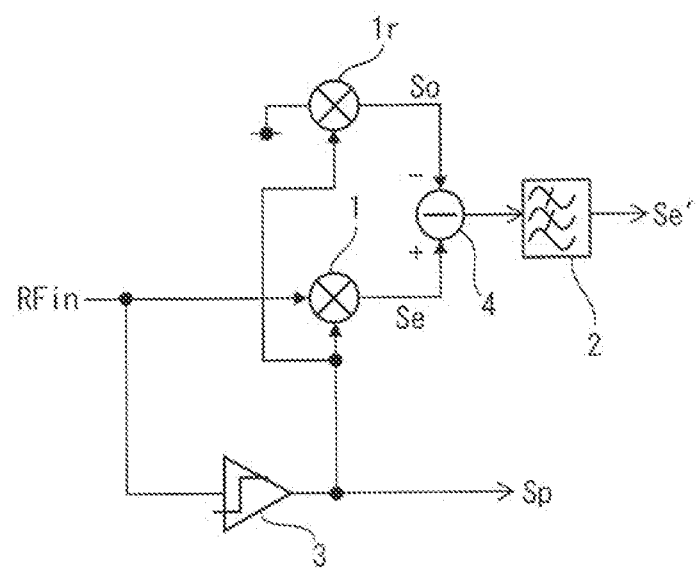
FIG. 10A and FIG. 10B are block diagrams each illustrating a modified example of the signal generation circuit illustrated in FIG. 8.
Figure 10B:
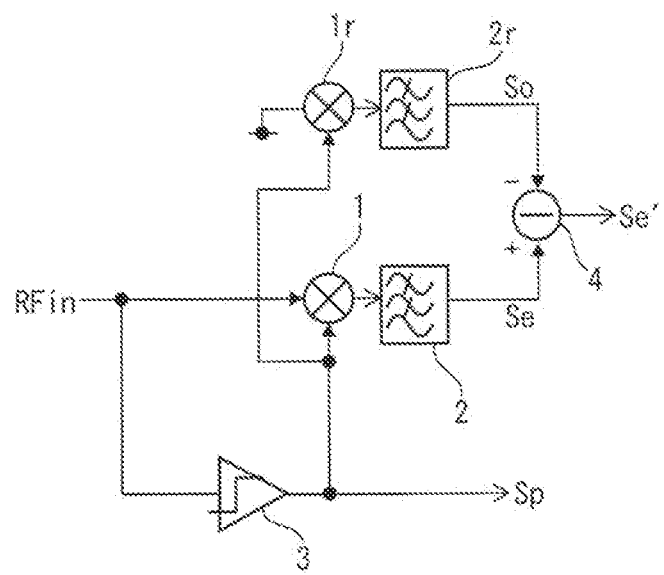

FIG. 10A and FIG. 10B are block diagrams each illustrating a modified example of the signal generation circuit illustrated in FIG. 8 and are equivalent to ones where the second embodiment is applied to the circuit of FIG. 4B.

FIG. 10A includes a low-pass filter 2 in a subsequent stage of the subtractor 4, and FIG. 10B includes low-pass filters 2 and 2r in subsequent stages of the mixer 1 and the replica mixer 1r, respectively.

A signal generation circuit illustrated in FIG. 10A includes the low-pass filter 2 in the subsequent stage of the subtractor 4. The replica mixer 1r and the subtractor 4 eliminate an offset voltage Voff from an amplitude signal Se' and thereafter the low-pass filter 2 reduces high frequency components.

A signal generation circuit illustrated in FIG. 10B includes a low-pass filter 2 (first low-pass filter) in the subsequent stage of the mixer 1 to reduce high frequency components of an amplitude signal Se and a low-pass filter 2r (second low-pass filter) in the subsequent stage of the replica mixer 1r to reduce high frequency components of an amplitude signal So.

Then, the subtractor 4 subtracts the amplitude signal So having reduced high frequency components from the amplitude signal Se having reduced high frequency components to eliminate an offset voltage. Herein, FIG. 10A and FIG. 10B are merely examples and further various modifications are employable.

Figure 11A:
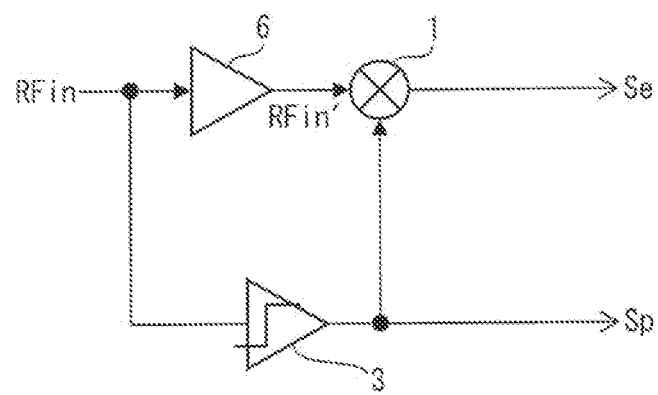
FIG. 11A and FIG. 11B are block diagrams each illustrating a signal generation circuit of a third embodiment.
Figure 11B:
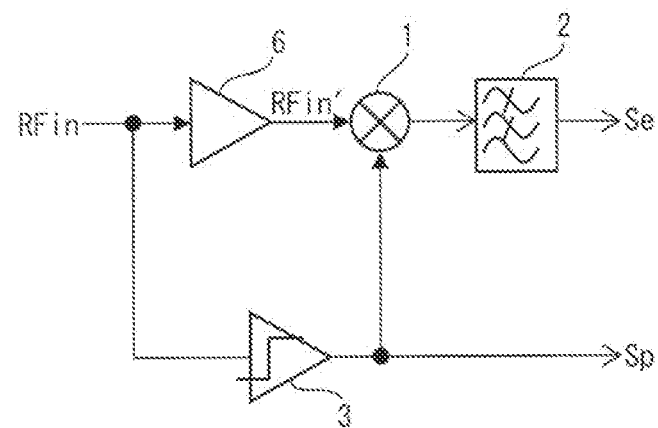

FIG. 11A and FIG. 11B are block diagrams each illustrating a signal generation circuit of a third embodiment and including a buffer 6 in a preceding stage of a first input of the mixer 1 to which a high frequency input signal RFin is input.

FIG. 11A is equivalent to one where the third embodiment is applied to the signal generation circuit illustrated in FIG. 4F, and FIG. 11B is equivalent to one where the third embodiment is applied to the signal generation circuit illustrated in FIG. 4B.

In the aforementioned embodiments, a high frequency input signal RFin and a phase signal Sp from the limiter 3 are multiplied in the mixer 1. However, if a delay in the limiter 3 is large, multiplication with a signal RFin with no delay is performed and thereby, a generated amplitude signal Se(Se') becomes small in some cases.

In this manner, when the amplitude signal Se becomes small, S/N (signal to noise) ratio degrades and then noise increases relatively. Therefore, the third embodiment illustrated in FIG. 11A and FIG. 11B includes the buffer 6 in the preceding stage of the first input of the mixer 1 to which she input signal RFin is input to allow a delay time of the buffer 6 to be substantially equal to that of the limiter 3.

Thereby, a timing error between the signal RFin input to the first input terminal of the mixer 1 and the phase signal Sp input to the second input terminal is reduced, which makes it possible to prevent a generated amplitude signal Se from becoming small. Therefore, an increase in noise due to S/N degradation is able to be prevented.

Figure 12A:
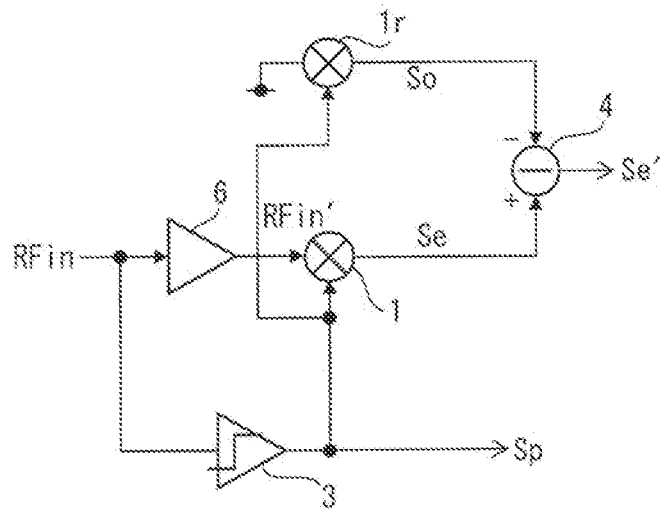
FIG. 12A, FIG. 12B, and FIG. 12C are block diagrams illustrating modified examples of the signal generation circuits illustrated in FIG. 11A and FIG. 11B.
Figure 12B:
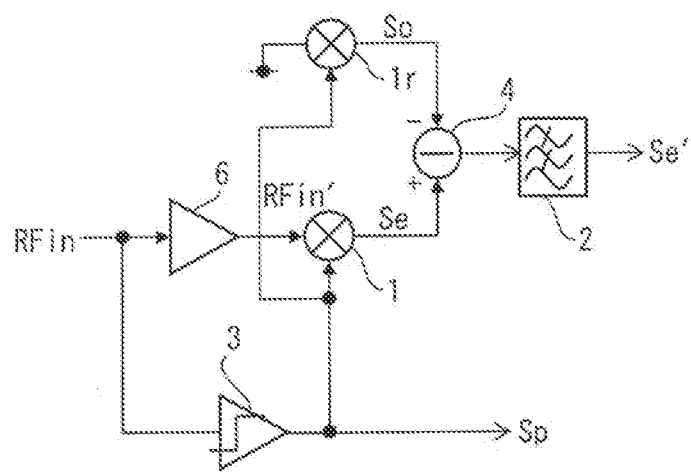
Figure 12C:
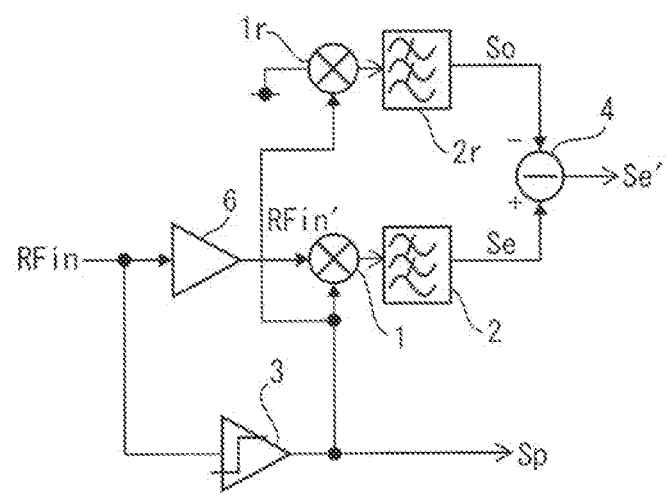

FIG. 12A, FIG. 12B, and FIG. 12C are block diagrams illustrating modified examples of the signal generation circuits illustrated in FIG. 11A and FIG. 11B. FIG. 12A is equivalent to one where the third embodiment is applied to the signal generation circuit illustrated in FIG. 8. FIG. 12B is equivalent to one where the third embodiment is applied to the signal generation circuit illustrated in FIG. 10A, and FIG. 12C is equivalent to one where the third embodiment is applied to the signal generation circuit illustrated in FIG. 10B.

In other words, the third embodiment is applicable to each embodiment described above, and its effect makes it possible to reduce a timing error between the signal RFin input to the mixer 1 and the phase signal Sp and to prevent a decrease in the amplitude signal Se and an increase in noise.

Figure 13:
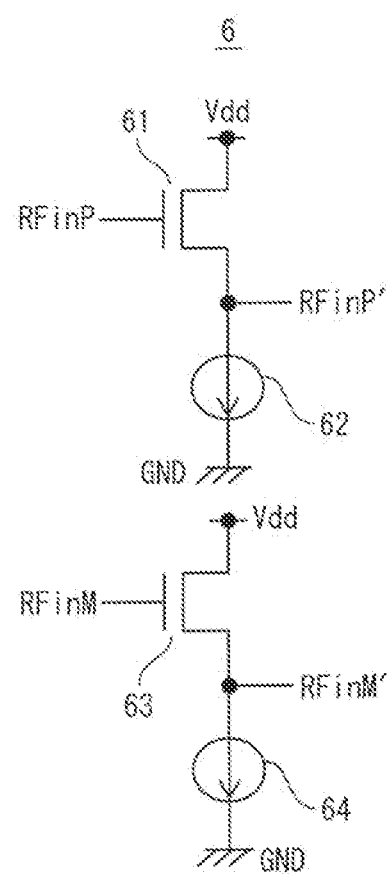
FIG. 13 is a circuit diagram illustrating one example of a buffer adopted in each embodiment.

FIG. 13 is a circuit diagram illustrating one example of the buffer adopted in each embodiment. As illustrated in FIG. 13, in the buffer 6, the same circuit configuration is applied to differential high frequency input signals RFinP and RFinM each.

In other words, the buffer 6 includes nMOS transistors 61 and 63 and power supplies 62 and 64. A positive logic input signal RFinP is input to the gate of the transistor 61 and then a delayed positive logic input signal RFinP' is output from a common connection node of the transistor 61 and the power supply 62.

In the same manner, a negative logic input signal RFinM is input to the gate of the transistor 63 and then a delayed negative logic input signal RFinM' is output from a common connection node of that transistor 63 and the power supply 64.

In other words, the buffer 6 illustrated in FIG. 13 is configured as a source follower circuit of an nMOS transistor for the differential input signals RFinP and RFinM. Herein, the buffer 6 illustrated in FIG. 13 is merely an example and needless to say, those having various types of circuit configurations are employable.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope or the invention.

What is claimed is:

1. A signal generation circuit comprising:
   a limiter configured to receive an input signal, allow the input signal to be off a scale at a limit voltage, and generate a phase signal indicating a phase component of the input signal;
   a mixer configured to receive the input signal and the phase signal, and generate an amplitude signal indicating an amplitude component of the input signal;
   a replica mixer configured to generate a replica offset voltage equivalent to an offset voltage of the mixer, the replica mixer having a configuration corresponding to the mixer; and
   a subtractor configured to subtract the replica offset voltage from the amplitude signal.

2. The signal generation circuit according to claim 1, wherein the mixer is further configured to generate the amplitude signal by multiplying the input signal and the phase signal.

3. The signal generation circuit according to claim 1, wherein the replica mixer is further configured to generate the replica offset voltage by multiplying a fixed input voltage and the phase signal.

4. The signal generation circuit according to claim 3, wherein the fixed input voltage comprises a power supply voltage, a grounding voltage or a predetermined bias voltage.

5. The signal generation circuit according to claim 1, further comprising:
   a low-pass filter configured to reduce high frequency components in the amplitude signal.

6. The signal generation circuit according to claim 5, wherein the low-pass filter is disposed in an output stage of the mixer.

7. The signal generation circuit according to claim 5, wherein the low-pass filter is disposed in an output stage of the subtractor.

8. The signal generation circuit according to claim 5, wherein the low-pass filter includes:
   a first low-pass filter in an output stage of the mixer; and
   a second low-pass filter in an output stage of the replica mixer.

9. A signal generation circuit comprising:
   a limiter configured to receive an input signal, allow the input signal to be off a scale at a limit voltage, and generate a phase signal indicating a phase component of the input signal;
   a mixer configured to receive the input signal and the phase signal, and generate an amplitude signal indicating an amplitude component of the input signal; and
   a buffer in a preceding stage of the mixer.

10. The signal generation circuit according to claim 9, wherein the buffer includes a delay time equivalent to a delay time in the limiter.

11. The signal generation circuit comprising:
    a limiter configured to receive an input signal, allow the input signal to be off a scale at a limit voltage, and generate a phase signal indicating a phase component of the input signal; and
    a mixer configured to receive the input signal and the phase signal, and generate an amplitude signal indicating an amplitude component of the input signal, wherein:
    the input signal is a differential signal;
    the phase signal contains positive and negative logic phase signals;
    the amplitude signal contains positive and negative logic amplitude signals; and
    the mixer includes:
    p-channel-type MOS transistors configured to receive the positive and negative logic phase signals at gates to generate the positive logic amplitude signal; and
    n-channel-type MOS transistors configured to receive the positive and negative logic phase signals at gates to generate the negative logic amplitude signal.

* * * * *